US012589947B2

(12) United States Patent
Yoon et al.

(10) Patent No.: US 12,589,947 B2
(45) Date of Patent: Mar. 31, 2026

(54) CONTAINER TRANSPORT APPARATUS AND LOGISTICS TRANSPORT SYSTEM INCLUDING THE SAME

(71) Applicant: SEMES CO., LTD., Chungcheongnam-do (KR)

(72) Inventors: Ki Sub Yoon, Gyeonggi-do (KR); Dong Pil Kang, Daegu (KR)

(73) Assignee: SEMES CO., LTD., Chungcheongnam-do (KR)

( * ) Notice: Subject to any disclaimer, the term of this patent is extended or adjusted under 35 U.S.C. 154(b) by 524 days.

(21) Appl. No.: 18/109,739

(22) Filed: Feb. 14, 2023

(65) Prior Publication Data

US 2023/0322496 A1 Oct. 12, 2023

(30) Foreign Application Priority Data

Apr. 7, 2022 (KR) ........................ 10-2022-0043405

(51) Int. Cl.
*B65G 43/02* (2006.01)
*H01L 21/677* (2006.01)

(52) U.S. Cl.
CPC .......... *B65G 43/02* (2013.01); *H01L 21/6773* (2013.01); *H01L 21/67733* (2013.01);
(Continued)

(58) Field of Classification Search
CPC .......... H01L 21/67259; H01L 21/6773; H01L 21/67733; B65G 1/0457; B65G 9/002;
(Continued)

(56) References Cited

U.S. PATENT DOCUMENTS

| 10,083,847 | B2 * | 9/2018 | Tomida | ............. | H01L 21/67259 |
| 10,255,785 | B1 * | 4/2019 | Huang | ............. | H01L 21/67724 |
(Continued)

FOREIGN PATENT DOCUMENTS

| KR | 10-0890523 | 3/2009 | | |
| KR | 100890523 B1 * | 3/2009 | ............. | B61L 27/04 |
(Continued)

OTHER PUBLICATIONS

Notice of Allowance dated Feb. 14, 2024 for Korean Patent Application No. 10-2022-0043405 and its English translation provided by Global Dossier.

(Continued)

*Primary Examiner* — Gene O Crawford
*Assistant Examiner* — Keith R Campbell
(74) *Attorney, Agent, or Firm* — WOMBLE BOND DICKINSON (US) LLP

(57) ABSTRACT

A container transport apparatus including an event recording unit suitable for the driving environment for a container transport vehicle in a semiconductor fabrication plant and a logistics transport system are provided. The container transport apparatus includes: a gripping module gripping a container with a plurality of substrates accommodated therein; an elevation module lifting up or down the gripping module; a driving module controlling driving wheels to drive on rails; a first control module controlling the gripping module, the elevation module, and the driving module; and an event recording unit continuously recording surroundings of the container transport apparatus and recording any events when the container transport apparatus is driving on the rails, wherein the event recording unit displays data on a screen of a manager terminal when displaying recorded images on the screen of the manager terminal.

19 Claims, 12 Drawing Sheets

(52) U.S. Cl.
CPC ................ *B65G 2201/0297* (2013.01); *B65G 2203/0275* (2013.01); *B65G 2203/041* (2013.01)

(58) Field of Classification Search
CPC .................... B65G 43/02; B65G 47/61; B65G 2201/0297; B65G 2203/0275; B65G 2203/041
See application file for complete search history.

(56) References Cited

U.S. PATENT DOCUMENTS

| | | | |
|---|---|---|---|
| 11,114,323 B2 * | 9/2021 | Ogawa | H01L 21/67715 |
| 11,449,544 B2 | 9/2022 | Choi et al. | |
| 12,153,016 B2 * | 11/2024 | Bae | G01N 27/64 |
| 2023/0014519 A1 | 1/2023 | Choi et al. | |
| 2024/0128113 A1 * | 4/2024 | Shimizu | B66C 13/46 |

FOREIGN PATENT DOCUMENTS

| | | |
|---|---|---|
| KR | 10-2018-0058019 | 5/2018 |
| KR | 10-2019-0127130 | 11/2019 |
| KR | 10-2098525 | 4/2020 |
| KR | 10-2021-0055295 | 5/2021 |
| KR | 10-2021-0103871 | 8/2021 |
| KR | 10-2022-0031346 | 3/2022 |

OTHER PUBLICATIONS

Office Action dated Oct. 6, 2023 for Korean Patent Application No. 10-2022-0043405 and its English machine translation by Google Translate.

* cited by examiner 510    520

| State | Output signal |
|---|---|
| CAM 1 Not Engaged | 00000001 |
| CAM 2 Not Engaged | 00000011 |
| CAM 1 & 2 Not Engaged | 00000111 |
| SD Memory Card Not Engaged | 00001111 |
| Imminent Expiration of Life of SD Memory Card | 00011111 |

CONTAINER TRANSPORT APPARATUS AND LOGISTICS TRANSPORT SYSTEM INCLUDING THE SAME

CROSS-REFERENCE TO RELATED APPLICATION

This application claims priority from Korean Patent Application No. 10-2022-0043405 filed on Apr. 7, 2022, in the Korean Intellectual Property Office, and all the benefits accruing therefrom under 35 U.S.C. 119, the contents of which in its entirety are herein incorporated by reference.

BACKGROUND

1. Field

The present disclosure relates to a container transport apparatus and a logistics transport system including the same, and more particularly, to a container transport apparatus including an event recording unit such as a black box and a logistics transport system including the container transport apparatus.

2. Description of the Related Art

Wafers used to fabricate semiconductor devices may be subject to various processes in a semiconductor fabrication plant (commonly called a "fab"), and may be transported to process facilities. For example, a plurality of wafers may be accommodated in a container such as a front opening unified pod (FOUP), the container may be transported to a process facility by a transport vehicle such as an overhead hoist transport (OHT), which is movably provided at the ceiling of a semiconductor fabrication plant.

Meanwhile, a transport vehicle may deviate from its designated driving route or may collide with other vehicles while transporting containers to each destination in a semiconductor fabrication plant. To record such events, a black box may be installed in each transport vehicle.

As black boxes are generally manufactured to be suitable for vehicles, there may be inconvenience for the driving environment for transport vehicles such as OHTs.

First, the storage space of Secure Digital (SD) memory cards for black boxes is partitioned by case, and the life of SD memory cards is generally very short.

Second, only events causing vibration changes can be identified with acceleration sensors, and there is difficulty in securing images for various error conditions.

Third, black boxes can be set only through touch screen panels (e.g., touch liquid crystal displays (LCDs)), and in order to update black boxes, SD memory cards need to be separated from the black boxes.

Fourth, as vehicle-related data is not displayed on the screen of black boxes, black boxes need to be accessed separately to identify vehicle-related data. Also, as black boxes generally do not interwork with controllers, there is difficulty in acquiring vehicle-related data from black boxes.

SUMMARY

Aspects of the present disclosure provide a container transport apparatus including an event recording unit, which is suitable for the driving environment for a container transport vehicle in a semiconductor fabrication plant, and a logistics transport system including the container transport apparatus.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a container transport apparatus includes: a gripping module gripping a container with a plurality of substrates accommodated therein; an elevation module lifting up or down the gripping module; a driving module controlling driving wheels to drive on rails; a first control module controlling the gripping module, the elevation module, and the driving module; and an event recording unit continuously recording surroundings of the container transport apparatus and recording any events when the container transport apparatus is driving on the rails, wherein the event recording unit displays data on a screen of a manager terminal when displaying recorded images on the screen of the manager terminal.

According to another aspect of the present disclosure, a container transport apparatus includes: a gripping module gripping a container with a plurality of substrates accommodated therein; an elevation module lifting up or down the gripping module; a driving module controlling driving wheels to drive on rails; a first control module controlling the gripping module, the elevation module, and the driving module; and an event recording unit continuously recording surroundings of the container transport apparatus and recording any events when the container transport apparatus is driving on the rails, wherein the event recording unit displays data on a screen of a manager terminal when displaying recorded images on the screen of the manager terminal, the event recording unit records a first image, which is a continuously recorded image, in a first zone from which images can be deleted and records a second image, which is associated with an event, in a second zone from which images cannot be deleted, the event recording unit records an image captured at a time of occurrence of the event separately or additionally records at least one of an image captured before the time of occurrence of the event and an image captured after the time of occurrence of the event, depending on the time of occurrence of the event, if error occurs in the event recording unit, the event recording unit transmits a message explaining the error to the first control module and the manager terminal by using a binary signal or by using at least two of a first signal generator, a second signal generator, which is of a different type from the first signal generator, and an alarm signal, the event recording unit provides a user interface for remote control on the screen of the manager terminal, and if the container transport apparatus is dispatched to a scene of an accident, the event recording unit transmits images associated with the scene of the accident to the first control module or the manager terminal.

According to another aspect of the present disclosure, a logistics transport system includes: a plurality of container transport apparatuses transporting containers with a plurality of substrates accommodated therein; and a transport control apparatus controlling the container transport apparatuses, wherein at least one of the container transport apparatuses includes a gripping module gripping a container with a plurality of substrates accommodated therein, an elevation module lifting up or down the gripping module, a driving module controlling driving wheels to drive on rails, a first control module controlling the gripping module, the elevation module, and the driving module, and an event recording unit continuously recording surroundings of the container transport apparatus and recording any events when the container transport apparatus is driving on the rails, and the event recording unit displays data on a screen of a manager terminal when displaying recorded images on the screen of the manager terminal.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
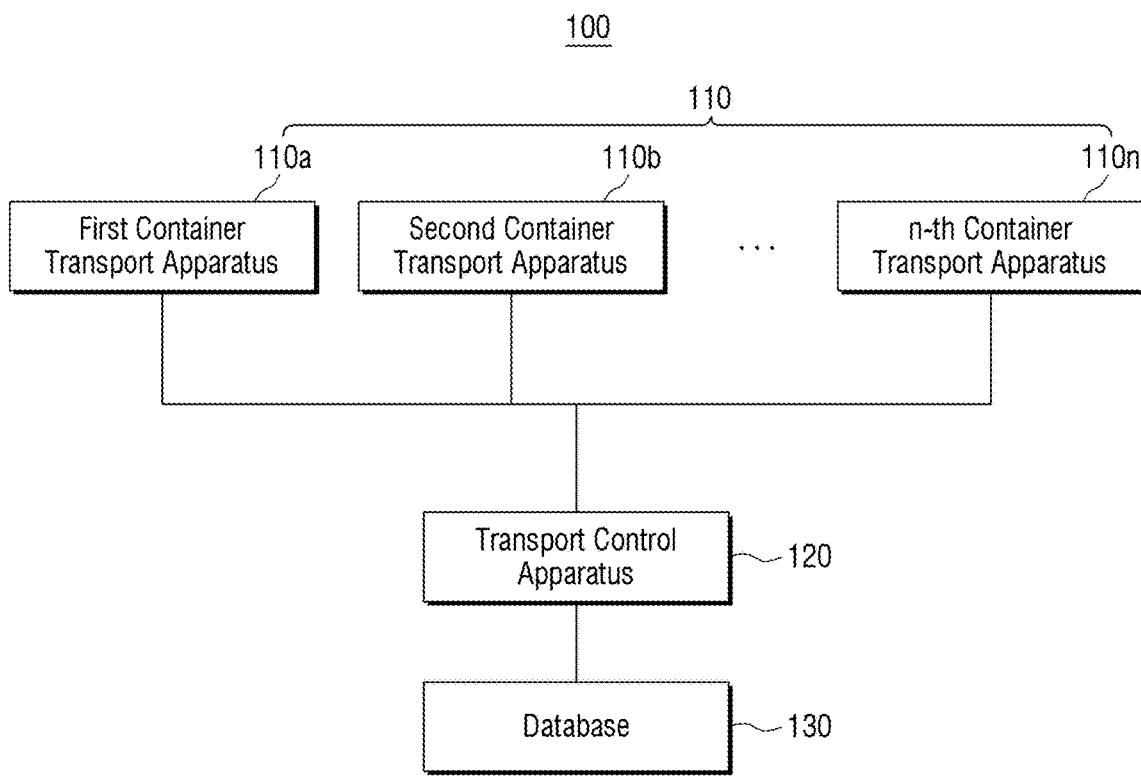
FIG. 1 is a block diagram of a logistics transport system including a plurality of container transport apparatuses.

Embodiments of the present disclosure will hereinafter be described with reference to the attached drawings. Like reference numerals indicate like elements throughout the specification and drawings.

The present disclosure relates to an event recording unit suitable for the driving environment for a container transport vehicle (e.g., an overhead hoist transport (OHT)) and a container transport apparatus including the event recording unit.

FIG. 1 is a block diagram of a logistics transport system including a plurality of container transport apparatuses.

Referring to FIG. 1, a logistics transport system 100 may include container transport apparatuses 110, a transport control apparatus 120, and a database 130. The logistics transport system 100 may be provided in a semiconductor fabrication plant to provide a logistics automation service.

The container transport apparatuses 110 transport containers to their respective destinations. The container transport apparatuses 110 may be provided as, for example, OHTs.

The container transport apparatuses 110 may travel along a moving route, for example, along rails installed at the ceiling of a semiconductor fabrication plant, to transport containers to their respective destinations. The container transport apparatuses 110 may transport containers to a process facility (e.g., a process chamber such as a deposition process chamber, an etching process chamber, a rinsing process chamber, or a thermal treatment process chamber). A plurality of container transport apparatuses 110, i.e., container transport apparatuses 110a, 110b, . . . , and 110n, may be provided in the semiconductor fabrication plant.

In a case where the container transport apparatuses 110a, 110b, . . . , and 110n are for transporting containers to each facility in the semiconductor fabrication plant, each of the containers may carry a plurality of substrates (or wafers) therein. The containers may be provided as, for example, front opening unified pods (FOUPs).

The container transport apparatuses 110a, 110b, . . . , and 110n may operate under the control of the transport control apparatus 120. Although not specifically illustrated in FIG. 1, the container transport apparatuses 110a, 110b, . . . , and 110n may include communication modules for communicating with the transport control apparatus 120 in a wired/wireless manner.

The container transport apparatuses 110a, 110b, . . . , and 110n may operate autonomously without being controlled by the transport control apparatus 120. In this case, multiple sensors may be installed along the moving route of the container transport apparatuses 110a, 110b, . . . , and 110n to provide information to prevent the container transport apparatuses 110a, 110b, . . . , and 110n from colliding with one another in the semiconductor fabrication plant, and the container transport apparatuses 110a, 110b, . . . , and 110n may be configured to be able to communicate with one another.

Figure 2:
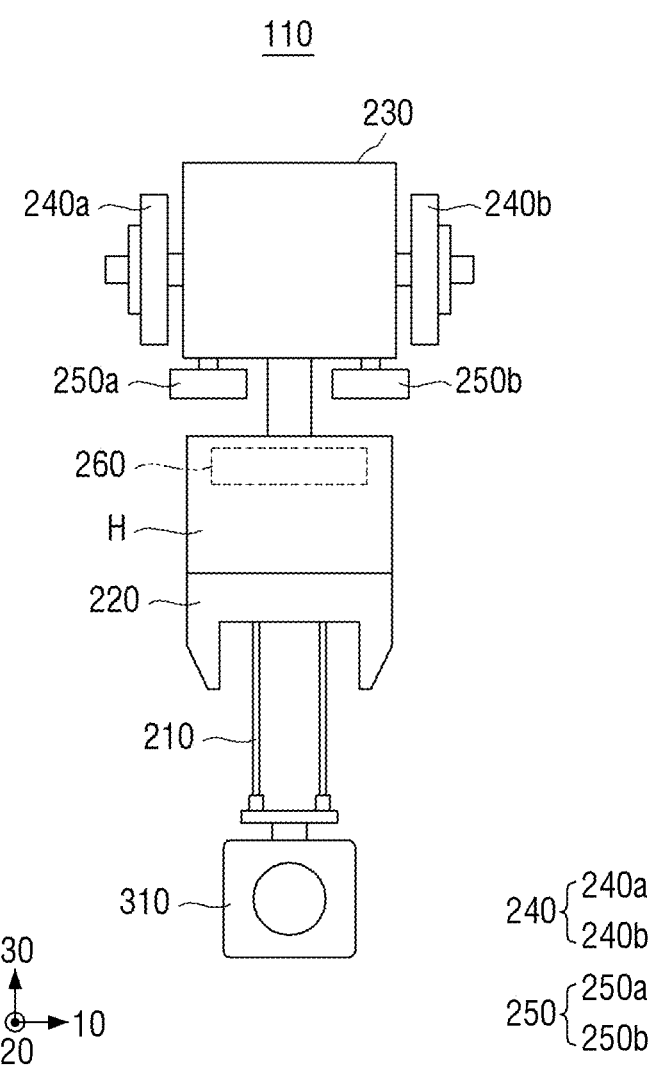
FIG. 2 is a schematic view of a container transport apparatus of FIG. 1.
Figure 3:
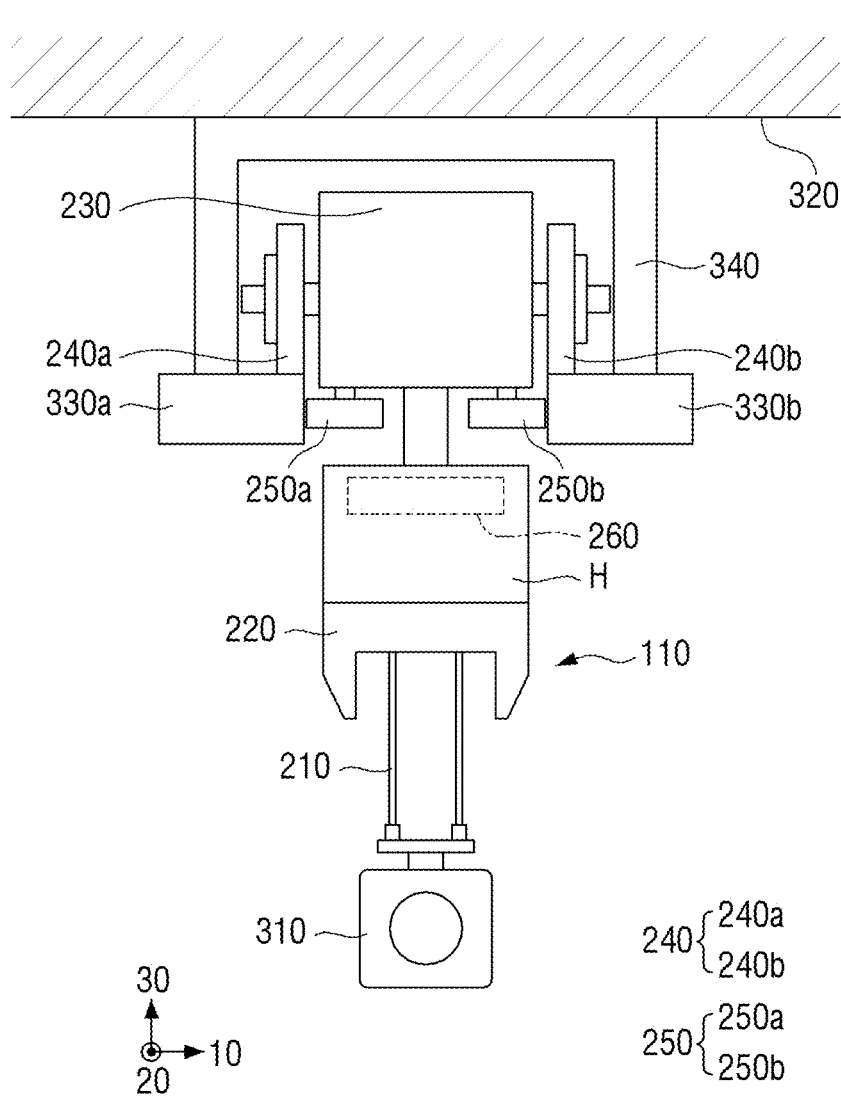
FIG. 3 is a schematic view illustrating how the container transport apparatus of FIG. 2 is installed in a semiconductor fabrication plant.

FIG. 2 is a schematic view of a container transport apparatus of FIG. 1, and FIG. 3 is a schematic view illustrating how the container transport apparatus of FIG. 2 is installed in the semiconductor fabrication plant. Referring to FIGS. 2 and 3, a container transport apparatus 110 may include a gripping module 210, an elevation module 220, a driving module 230, driving wheels 240, guide wheels 250, and a first control module 260.

The gripping module 210 is provided to grip a container 310. The gripping module 210 may be lifted down to a location (e.g., an equipment front end module (EFEM)) where the container 310 is placed to grip the container 310. The gripping module 210 may be provided as, for example, a hand gripper.

The elevation module 220 is provided to lift up or down the gripping module 210. The elevation module 220 may be lift down the gripping module 210 in a direction from a ceiling 320 of the semiconductor fabrication plant to the ground to grip the container 310, and may lift up the gripping module 210 to the ceiling 320 once the gripping module 210 grips the container 310. The elevation module 220 may be provided as, for example, a hoist.

Once the container 310 is loaded by the gripping module 210 and the elevation module 220, the container transport apparatus 110 may transport the container 310 to its destination. When the container transport apparatus 110 arrives at the destination, the elevation module 220 lifts down the gripping module 210 again, and the gripping module 210 releases the container 310 on a load port module of the EFEM such that the substrates contained in the container 310 may be delivered to a subsequent process facility in the semiconductor fabrication plant.

Although not specifically illustrated in FIGS. 2 and 3, the container transport apparatus 110 may include a storage module, which provides storage space, instead of the gripping module 210. The storage module may be formed in a shape with an open top, for example, in a basket shape, or in a shape with a door on a side thereof, for example, in a cabinet shape, to accommodate the container 310 therein.

The driving module 230 may control the driving wheels 240, which travel along the moving route (e.g., a pair of rails 330a and 330b) installed at the ceiling 320. Although not specifically illustrated in FIGS. 2 and 3, the driving module 230 may include a driving motor and a driving shaft. The driving motor may generate a driving force, and the driving shaft may provide the driving force to the driving wheels 240.

The driving wheels 240, which rotate with a driving force provided by the driving module 230, allow the container transport apparatus 110 to travel along the rails 330a and 330b. A pair of driving wheels 240, i.e., driving wheels 240a and 240b, may be provided to travel along the rails 330a and 330b, respectively, in which case, the driving wheels 240a and 240b may be coupled to both sides of the driving module 230.

The guide wheels 250 prevents the container transport apparatus 110 from deviating from the rails 330a and 330b while driving along the rails 330a and 330b. A pair of guide wheels 250, i.e., guide wheels 250a and 250b, may be provided and may be installed at both ends of the bottom surface of the driving module 230, perpendicularly to the driving wheels 240a and 240b.

The first control module 260 controls the other modules of the container transport apparatus 110. The first control module 260 may control the operation of the gripping module 210 and the elevation module 220 and may also control the operation of the driving motor of the driving module 230. Although not specifically illustrated in FIGS. 2 and 3, the first control module 260 may include a front frame and a rear frame and may support the gripping module 210 and the elevation module 220, which are coupled to the bottom surface of the first control module 260. The first control module 260 may be provided as, for example, an OHT controller.

Although not specifically illustrated in FIGS. 2 and 3, the first control module 260 may include a speed controller and a position controller. The speed controller may control the rotation speed of the driving wheels 240, and the position controller may adjust the position of the container 310.

The position controller may include a slider and a rotator. The slider may move the container 310 in a vertical direction or in a horizontal direction, and the rotator may rotate the container 310 clockwise or counterclockwise.

To provide a moving route for the container transport apparatus 110, a rail assembly including the rails 330a and 330b and a rail support module 340 may be installed at the ceiling 320. The rails 330a and 330b, which provide a driving route for the container transport apparatus 110, may be coupled to both ends of the rail support module 340, which is fixed onto the ceiling 320.

The rails 330a and 330b may include various types of sections such as rectilinear sections, curved sections, inclined sections, branch sections, and crossing sections, but the present disclosure is not limited thereto. The rails 330a and 330b may be configured to include sections of only one type.

The rail support module 340 is fixed to the ceiling 320 and supports the rails 330a and 330b. The rail support module 340 may be installed at the ceiling 320 to have a cap shape, as viewed from the ground.

Referring again to FIG. 1, the transport control apparatus 120 controls the container transport apparatuses 110a, 110b, . . . , and 110n. The transport control apparatus 120 can control each of the container transport apparatuses 110a, 110b, . . . , and 110n independently such that each of the transport apparatuses 110a, 110b, . . . , and 110n can safely transport a container 310 to its destination (e.g., a process facility in the semiconductor fabrication plant).

The transport control apparatus 120 may control the driving of the container transport apparatus 110 by sending signals such as a start command, a stop command, an acceleration command, and a deceleration command to the container transport apparatuses 110a, 110b, . . . , and 110n. Also, the transport control apparatus 120 may provide necessary information (e.g., routes to destinations) to the container transport apparatuses 110a, 110b, . . . and 110n through wired/wireless communication with the container transport apparatuses 110a, 110b, . . . , and 110n.

To perform these functions, the transport control apparatus 120 may recognize the locations of the container transport apparatuses 110a, 110b, . . . , and 110n. To this end, the transport control apparatus 120 may use a plurality of sensors installed around the rails 330a and 330b and may use the result of wired/wireless communication with each of the container transport apparatuses 110a, 110b, . . . , and 110n.

In the former case, the transport control apparatus 120 may recognize the locations of the container transport apparatuses 110a, 110b, . . . , and 110n using identification information of the sensors (e.g., serial number), location information of the sensors (e.g., two-dimensional (2D) or three-dimensional (3D) coordinate information ((x, y) or (x, y, z)) of the sensors, or identification information of the container transport apparatuses 110a, 110b, . . . , and 110n passing through the sensors. On the contrary, in the latter case, the container transport apparatuses 110a, 110b, . . . , and 110n may be able to measure their own locations, and the transport control apparatus 120 may recognize the locations of the container transport apparatuses 110a, 110b, . . . , and 110n by communicating with the container transport apparatuses 110a, 110b, . . . , and 110n.

The transport control apparatus 120 may be provided as a computer or a server including a process controller, a control program, an input module, an output module (or a display module), and a memory module to control the container transport apparatuses 110a, 110b, . . . , and 110n. Here, the process controller may include a microprocessor controlling each of the elements of the logistics transport system 100, the control program may execute various processes performed in the logistics transport system 100 under the control of the process controller, and the memory module may store programs (i.e., process recipes) for executing various processes in the logistics transport system 100 based on various data in accordance with various process conditions.

The database 130 may store information necessary for controlling the container transport apparatuses 110a, 110b, . . . , and 110n. To provide necessary information to the transport control apparatus 120, the database 130 may be mounted in the transport control apparatus 120 or may be provided as a separate element outside the transport control apparatus 120 and be connected to the transport control apparatus 120 in a wired/wireless manner.

As already mentioned above, a black box installed in a vehicle may not be suitable for the driving environment for the container transport apparatuses 110a, 110b, . . . , and 110n (e.g., OHTs) for various reasons. An event recording unit suitable for the driving environment for the container transport apparatuses 110a, 110b, . . . , and 110n will hereinafter be described.

Figure 4:
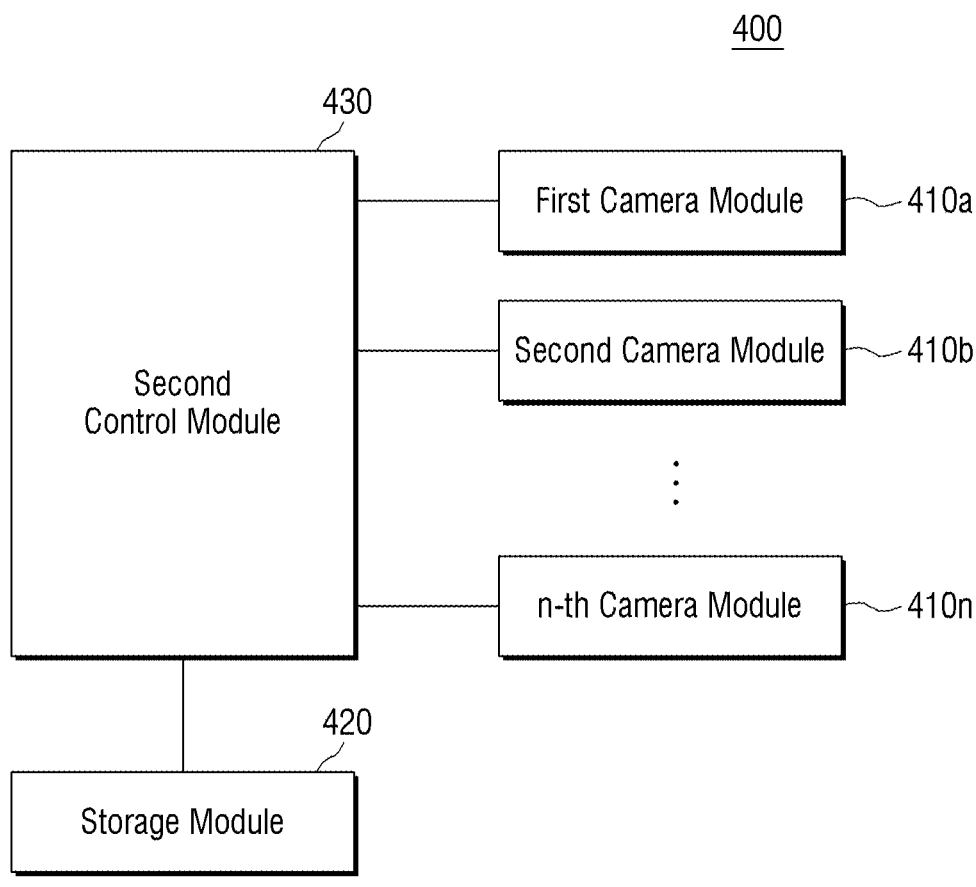
FIG. 4 is a block diagram of an event recording unit installed in a container transport apparatus, according to an embodiment of the present disclosure.

FIG. 4 is a block diagram of an event recording unit installed in a container transport apparatus, according to an embodiment of the present disclosure. Referring to FIG. 4, an event recording unit 400 may include a plurality of camera modules 410a, 410b, . . . , and 410n, a storage module 420, and a second control module 430, and the camera modules 410a, 410b, . . . , and 410b may include first and second camera modules 410a and 410b.

The event recording unit 400, like a black box, captures images of the surroundings of a container transport apparatus 100 and records events occurred in the container transport apparatus 110. The event recording unit 400 may be installed in the same space as a first control module 260 of the container transport apparatus 110, i.e., in a housing H, and may be installed in a separate space.

The camera modules 410a, 410b, . . . , and 410n may be installed in the container transport apparatus 110 and may capture images of the surroundings of the container transport apparatus 110. The event recording unit 400 will hereinafter be described as including, for example, two camera modules, i.e., the first and second camera modules 410a and 410b, but the present disclosure is not limited thereto.

The first camera module 410a captures an image of the front of the container transport apparatus 110. To this end, the first camera module 410a may be disposed at the front of the container transport apparatus 110, for example, on a front frame at the front of the housing H, in which the first control module 260 is mounted. Here, the front of the container transport apparatus 110 refers to a forward driving direction of the container transport apparatus 110.

The second camera module 410b captures an image of the rear of the container transport apparatus 110. To this end, the second camera module 410b may be disposed at the rear of the container transport apparatus 110, for example, on a rear frame at the rear of the housing H, in which the first control module 260 is mounted. Here, the rear of the container transport apparatus 110 refers to a reverse or backward driving direction of the container transport apparatus 110.

The first and second camera modules 410a and 410b may capture images of the surroundings of the container transport apparatus 110 in different directions. The first camera module 410a may capture an image of the front of the container transport apparatus 110, and the second camera module 410b may capture an image of the rear of the container transport apparatus 110. However, the present disclosure is not limited to this. The directions in which the first and second camera modules 410a and 410b capture images of the surroundings of the container transport apparatus 110 are not particularly limited, as long as they are different. For example, the first camera module 410a may capture an image of the front of the container transport apparatus 110, and the second camera module 410b may capture an image of a side of the container transport apparatus 110. In another example, the first camera module 410a may capture an image of one side of the container transport apparatus 110, and the second camera module 410b may capture an image of the other side of the container transport apparatus 110. In another example, the first camera module 410a may capture an image of the front and one side of the container transport apparatus 110, and the second camera module 410b may capture an image of the rear and the other side of the container transport apparatus 110.

Although the first and second camera modules 410a and 410b capture images of the surroundings of the container transport apparatus 110 in different directions, there may exist directions that are not covered by the first and second camera modules 410a and 410b. To remove any blind spots not covered by the first and second camera modules 410a and 410b, the first and second camera modules 410a and 410b may be configured to be rotatable.

The first and second camera modules 410a and 410b may be rotatable in the horizontal direction (i.e., in a first or second direction 10 or 20) or in the vertical direction (i.e., in a third direction 30). The first and second camera modules 410a and 410b may be rotatable in both the horizontal and vertical directions or may be rotatable in only one of the horizontal and vertical directions.

In a case where the first and second camera modules 410a and 410b are configured to be rotatable only in one direction, the first and second camera modules 410a and 410b may be rotatable in the same direction. For example, the first and second camera modules 410a and 410b may both be horizontally rotatable, but the present disclosure is not limited thereto. Alternatively, the first and second camera modules 410a and 410b may be rotatable in different directions. For example, the first camera module 410a may be rotatable in the horizontal direction, and the second camera module 410 may be rotatable in the vertical direction.

The event recording unit 400 may include only one of the first and second camera modules 410a and 410b and may be able to remove any blind spots using only one of the first and second camera modules 410a and 410b. Alternatively, the event recording unit 400 may include both the first and second camera modules 410a and 410b and may further include at least one additional camera module and may be able to remove any blind spots using three or more camera modules.

The storage module 420 may store images captured by the first and second camera modules 410a and 410b. The storage module 420 may be provided as a detachable card such as, for example, a Secure Digital (SD) memory card that can be installed in a black box, but the present disclosure is not limited thereto. Alternatively, the storage module 420 may be provided in the event recording unit 400 as a fixed memory.

The storage space of an SD memory card applicable to a black box for a vehicle is partitioned such that recorded images may be stored separately by case. However, the SD memory card may have a short loop time and may have a short life accordingly.

To address these, the storage space of the storage module 420 may be configured to include only a first recording zone 510, in which images from a constant recording are stored, and as a result, the loop time and the life of an SD memory card may increase. That is, the event recording unit 400 may use only a continuous recording function, thereby maintaining the life of an SD memory card as much as possible.

Figure 5:
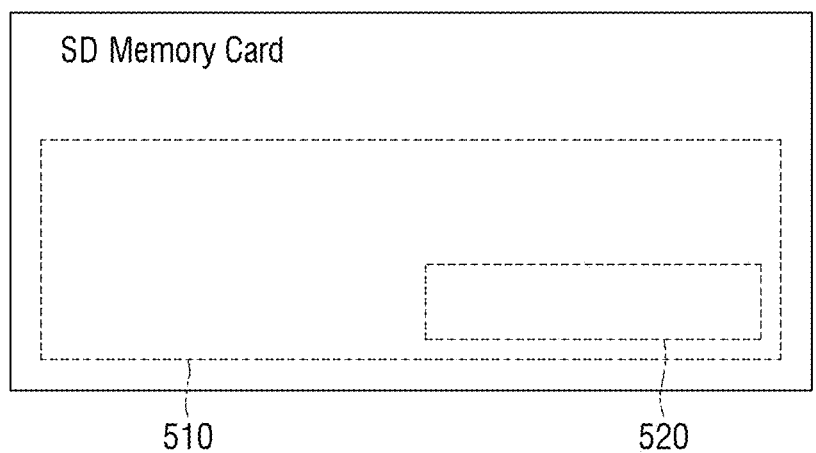
FIG. 5 is a block diagram of a storage module of the event recording unit of FIG. 4.

The storage module 420 may include a second recording zone 520 in its storage space. The second recording zone 520 may be a region where images generated upon the occurrence of events in the container transport apparatus 110 are stored, and may be included in the first recording zone 510, as illustrated in FIG. 5. As the second recording zone 520 is included in the first recording zone 510, the size of the second recording zone 520 can be freely adjusted within the storage space of the first recording zone 510, depending on the size of images generated from continuous recordings or the size of images generated upon the occurrence of events.

However, the present disclosure is not limited to this. The second recording zone 520 may be provided as a separate region from the first recording zone 510. FIG. 5 is a block diagram of the storage module of the event recording unit of FIG. 4.

Referring again to FIG. 4, the second control module 430 controls the elements of the event recording unit 400. The second control module 430 may control the operations of, for example, the first and second camera modules 410a and 410b and may also control data to be stored in the storage module 420.

Figure 6:
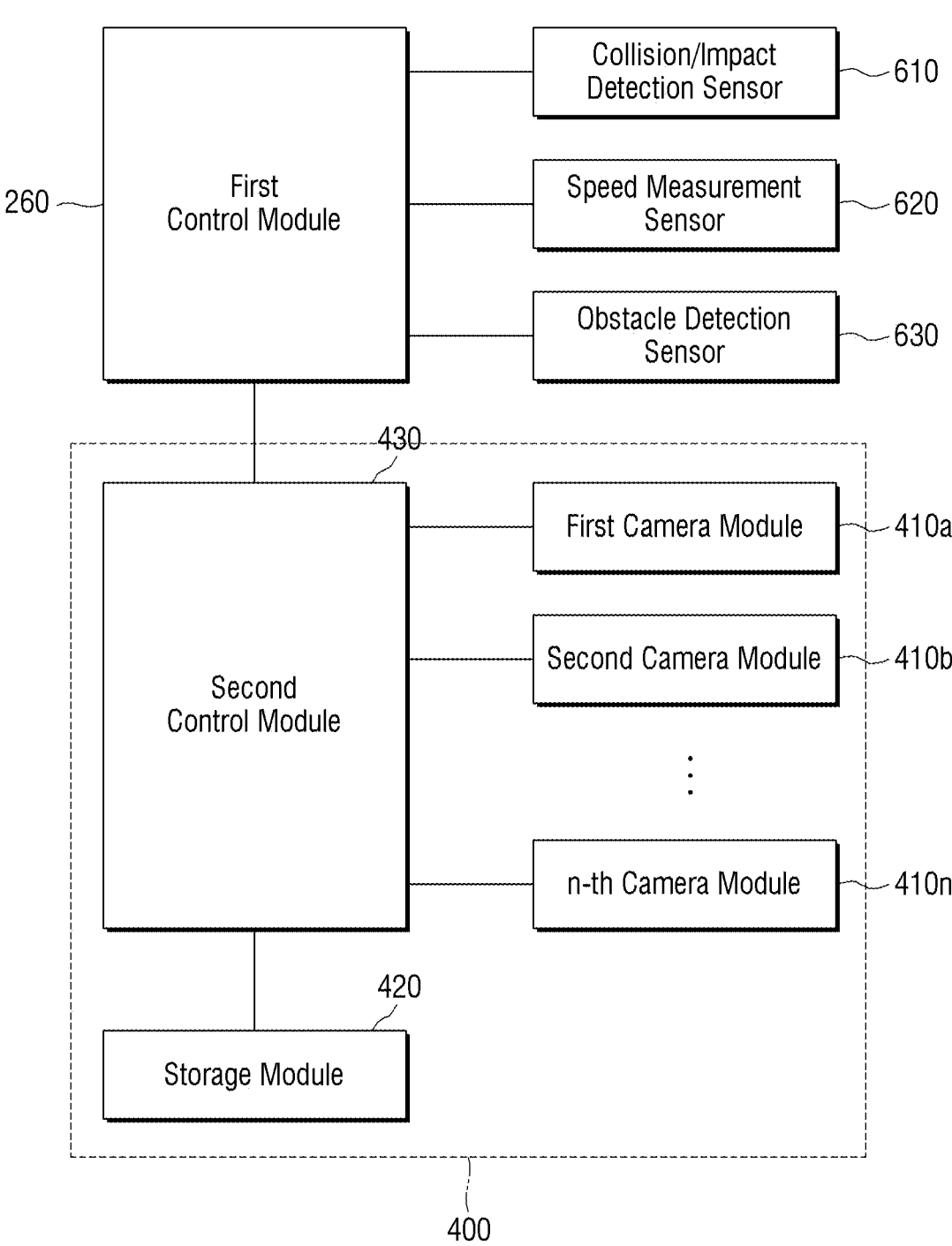
FIG. 6 is a block diagram illustrating how a second control module of the event recording unit of FIG. 4 interworks with a first control module of a container transport apparatus.

Referring to FIG. 6, the second control module 430 may interwork with the first control module 260 of the container transport apparatus 110 and may control various types of sensors installed in the container transport apparatus 110. For example, a collision/impact detection sensor 610, a speed measurement sensor 620, and an obstacle detection sensor 630 may be installed in the container transport apparatus 110, and the second control module 430 may control the collision/impact detection sensor 610, the speed measurement sensor 620, and the obstacle detection sensor 630 by interworking with the first control module 260.

The collision/impact detection sensor 610 may detect a collision between the container transport apparatus 110 and another apparatus or device or shock applied to the container transport apparatus 110 from the outside and may be provided as a contact-type sensor (e.g., a bumper) or as a non-contact-type sensor.

The speed measurement sensor 620 may measure the speed of the container transport apparatus 110 and may be provided as, for example, an Internet of Things (IoT) module including an acceleration sensor.

The obstacle detection sensor 630 may detect the presence of any obstacle around the container transport apparatus 110 and may also detect the presence of another container transport apparatus or look down on the moving route of the container transport apparatus 110. The obstacle detection sensor 630, like the collision/impact detection sensor 610, may be provided as, for example, a contact-type sensor or as a non-contact-type sensor (e.g., a non-contact-type obstacle detection sensor (ODS)).

The second control module 430 may be directly connected to the collision/impact detection sensor 610, the speed measurement sensor 620, and the obstacle detection sensor 630 to control the collision/impact detection sensor 610, the speed measurement sensor 620, and the obstacle detection sensor 630. FIG. 6 is a block diagram illustrating how the second control module of the event recording unit of FIG. 4 interworks with a first control module of a container transport apparatus.

As already mentioned above, the event recording unit 400 may record images captured by the first and second camera modules 410a and 410b, and this will hereinafter be described.

The first and second camera modules 410a and 410b may capture images of the surroundings of the container transport apparatus 110 in real time, and the second control module 430 may continuously record the captured images in the first recording zone 510 of the storage module 420, which is 24-hour continuous recording. Once the first recording zone 510 is filled up with images, the second control module 430 may delete the oldest images stored in the first recording zone 510 to store new images and may store the new images in the first recording zone 510.

In response to an event signal being received from the first control module 260, which is interlocked with the second control module 430, the second control module 430 may record images captured by the first and second camera modules 410a and 410b at the time of receipt of the event signal in the second recording zone 520 and may thus prevent images associated with the event signal from being deleted.

The first control module 260 may generate an event signal based on information acquired by the collision/impact detection sensor 610, the speed measurement sensor 620, and the obstacle detection sensor 630 and may output the event signal to the second control module 430. Then, the second control module 430 may record images captured at the time of the receipt of the event signal output by the first control module 260 in the second recording zone 520 and may also record images captured before and/or after the receipt of the event signal output by the first control module 260 in the second recording zone 520.

For example, the first control module 260 may determine whether a collision has occurred between the container transport apparatus 110 and another apparatus based on information acquired by the collision/impact detection sensor 610. If the first control module 260 determines that a collision has occurred between the container transport apparatus 110 and another apparatus, the second control module 430 may record images captured at the time of the collision and images captured before and after the time of the collision in the second recording zone 520. Alternatively, the second control module 430 may record only the images captured at the time of the collision in the second recording zone 520. Alternatively, the second control module 430 may record either the images captured at the time of the collision or the images captured before and after the time of the collision in the second recording zone 520.

Also, the first control module 260 may determine whether there exists an obstacle on the moving route of the container transport apparatus 110 based on information acquired by the obstacle detection sensor 630. Also, the first control module 260 may calculate the current speed of the container transport apparatus 110 based on information acquired by the speed measurement sensor 620 and may determine whether there is a probability that the container transport apparatus 110 will collide with the obstacle based on the current speed of the container transport apparatus 110. If the first control module 260 determines that there is a probability that the container transport apparatus 110 will collide with the obstacle, the second control module 430 may record forward images captured at the time of the detection of the obstacle and forward images captured before and after the time of the detection of the obstacle in the second recording zone 520. Alternatively, the second control module 430 may record either the images captured at the time of the detection of the obstacle or the images captured before and after the time of the detection of the obstacle in the second recording zone 520. In this manner, images for various error and emergency conditions can be secured.

The second control module 430 may be directly connected to the collision/impact detection sensor 610, the speed measurement sensor 620, and the obstacle detection sensor 630 to perform the analyses by the first control module 260.

As the second recording zone 520, like the first recording zone 510, has a limited storage space, event-related images may not be able to be stored in the second recording zone 520 once the second recording zone 520 is used up. To address this, the second control module 430 may create an additional second recording zone in the first recording zone 510 and may store event-related images in the additional second recording zone 520. Alternatively, the second control module 430 may transmit the oldest images stored in the second recording zone 520 to a manager terminal (e.g., a computer, a smartphone, or a tablet personal computer (PC) accessed by a manager), may delete the oldest images stored in the second recording zone 520, and may store event-related images in the second recording zone 520.

As already mentioned above, the second control module 430 may store images captured at the time of receipt of an event signal from the first control module 260 in the second recording zone 520 and may also store images captured before and/or after the time of receipt of the event signal in the second recording zone 520. Alternatively, the second control module 430 may create new images by combining the images captured at the time of receipt of the event signal and the images captured before and/or after the time of receipt of the event signal and may store the new images in the second recording zone 520. For example, the second control module 430 may create new images by combining the images captured at the time of receipt of the event signal and images captured 30 seconds before and/or after the time of receipt of the event signal and may store the new images in the second recording zone 520.

The second control module 430 may divide each of images captured in real time by the first and second camera modules 410a and 410b into sub-images having a predetermined length of time and may store the segments in the first recording zone 510. For example, referring to FIG. 7, the second control module 430 may divide each of images captured for six minutes by the first and second camera modules 410a and 410b into three images having a length of 2 minutes, i.e., image A (710), image B (720), and image C (730), and may store the three images 710, 720, and 730 in the first recording zone 510.

Figure 7:
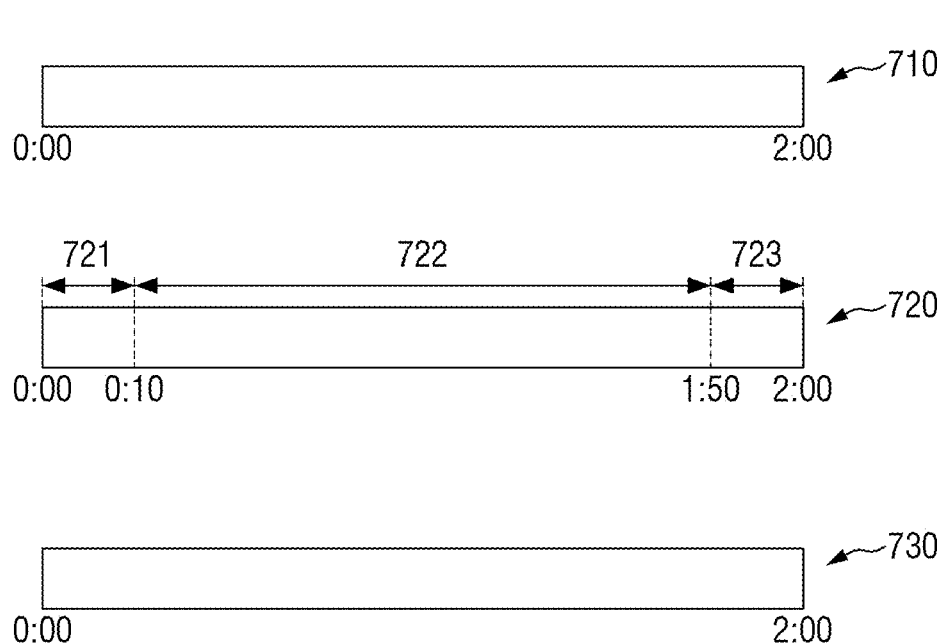
FIG. 7 is a schematic view illustrating an image recording function of the second control module of the event recording unit of FIG. 4.

The second control module 430 may divide each of image A (710), image B (720), and image C (730) into three sections, i.e., first, second, and third sections, according to the lapse of time. The first, second, and third sections may have the same length of time or may have different lengths of time. Alternatively, some of the first, second, and third sections may have the same length of time, and some of the first, second, and third sections may have the same length may have different lengths of time. In the example of FIG. 7, image B (720) may have first, second, and third sections 721, 722, and 723, and the first section 721 may have a length of time from 0 minutes 0 seconds (0:00) to 0 minutes 10 seconds (0:10), the second section 722 has a length of time from 0 minutes 11 seconds (0:11) to 1 minute 49 seconds (1:49), and the third section 723 may have a length of time from 1 minute 50 seconds (1:50) to 2 minutes 0 seconds (2:00).

If the time of receipt of the event signal is included in first sections of images captured by the first and second camera modules 410a and 410b, which are the earliest sections of the corresponding images, the second control module 430 may store images captured at the time of receipt of the event signal and images captured before the time of receipt of the event signal in the second recording zone 520. In this case, the second control module 430 may store the images captured at the time of receipt of the event signal and the images captured before the time of receipt of the event signal separately in the second recording zone 520, or may create new images by combining the images captured at the time of receipt of the event signal and the images captured before the time of receipt of the event signal separately in the second recording zone 520 and store the new images in the second recording zone 520.

For example, if the event signal is received from the first control module 260 between 2 minutes 0 seconds (2:10) and 2 minutes 10 seconds (2:10) into 6-minute long images captured by the first and second camera modules 410a and 410b, the second control module 430 may store image A (710) and image B (720) of each of the 6-minute long images separately in the second recording zone 520, or may create a new image by combining image A (710) and image B (720) of each of the 6-minute long images and store the new image in the second recording zone 520.

If the time of receipt of the event signal is included in third sections of images captured by the first and second camera modules 410a and 410b, which are the latest sections of the corresponding images, the second control module 430 may store images captured at the time of receipt of the event signal and images captured after the time of receipt of the event signal in the second recording zone 520. In this case, the second control module 430 may store the images captured at the time of receipt of the event signal and the images captured after the time of receipt of the event signal separately in the second recording zone 520, or may create new images by combining the images captured at the time of receipt of the event signal and the images captured after the time of receipt of the event signal separately in the second recording zone 520 and store the new images in the second recording zone 520.

For example, if the event signal is received from the first control module 260 between 3 minutes 50 seconds (3:50) and 4 minutes 0 seconds (4:00) into 6-minute long images captured by the first and second camera modules 410a and 410b, the second control module 430 may store image B (720) and image C (730) of each of the 6-minute long images separately in the second recording zone 520, or may create a new image by combining image B (720) and image C (730) of each of the 6-minute long images and store the new image in the second recording zone 520.

If the time of receipt of the event signal is included in second sections of images captured by the first and second camera modules 410a and 410b, which are the middle sections, in time, of the corresponding images, the second control module 430 may store images captured at the time of receipt of the event signal in the second recording zone 520. For example, if the event signal is received from the first control module 260 between 2 minutes 11 seconds (2:11) and 3 minutes 49 seconds (3:49) into 6-minute long images captured by the first and second camera modules 410a and 410b, the second control module 430 may store only image B (720) of each of the 6-minute long images in the second recording zone 520. FIG. 7 is a schematic view illustrating an image recording function of the second control module of the event recording unit of FIG. 4.

Figure 8:
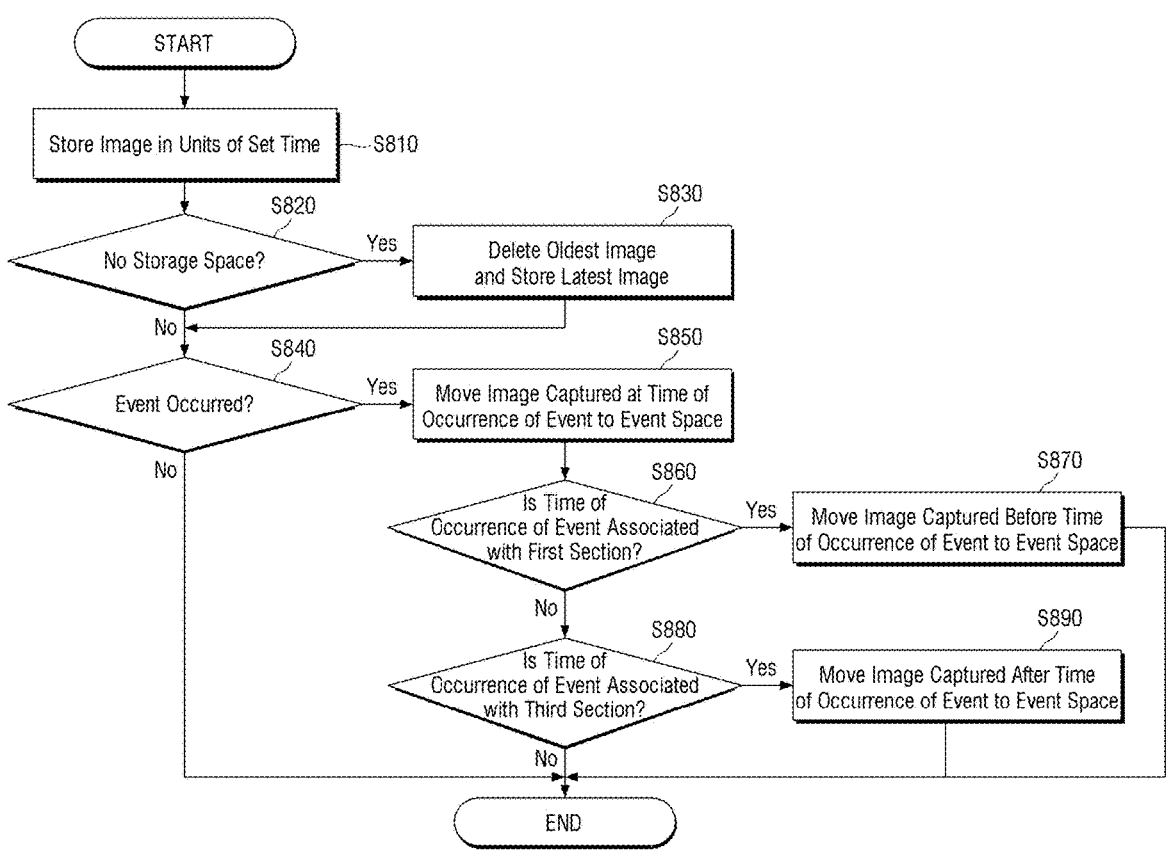
FIG. 8 is a flowchart illustrating an operating method for the image recording function of the second control module of the event recording unit of FIG. 4.

An operating method of the second control module 430 in connection with the image recording function will hereinafter be described. FIG. 8 is a flowchart illustrating an operating method for the image recording function of the second control module of the event recording unit of FIG. 4.

Referring to FIG. 8, the second control module 430 divides an image captured in real time by each of the first and second camera modules 410a and 410b into sub-images having a predetermined length of time (for example, a length of 2 minutes) and records the sub-images in the first recording zone 510 (S810). The first and second camera modules 410a and 410b may capture images in units of a predetermined amount of time and may provide the captured images to the second control module 430. In this case, the second control module 430 may not divide an image captured by each of the first and second camera modules 410a and 410b. Here, the predetermined amount of time may be determined by the manager and may vary.

If images cannot be stored any longer in the first recording zone 510 (S820), the second control module 430 may delete the oldest image stored in the first recording zone 510 and may record a newly-acquired image in the first recording area 510 (S830).

If an event signal is received from the first control module 260 (S840), the second control module 430 may record an image captured at the time of receipt of the event signal in the second recording zone 520 (S850). For example, if a look down of the container transport apparatus 100 is detected by the sensors installed in the container transport apparatus 110, the first control module 260 may transmit an event signal to the second control module 430, and the second control module 430 may move a loading/unloading image captured at the time of transmission of the event signal to the second recording zone 520. Also, if a collision/impact or an obstacle is detected by the sensors installed in the container transport apparatus 110, the first control module 260 may transmit an event signal to the second control module 430, and the second control module 430 may move a driving image captured at the time of transmission of the event signal to the second recording zone 520.

The second control module 430 may divide an image captured at the time of receipt of an event signal (or at the time of occurrence of an event) into three sections, i.e., first, second, and third sections. Then, if the time of occurrence of the event corresponds to the first section (S860), the second control module 430 also records an image captured before the time of occurrence of the event in the second recording zone 520 (S870). If the time of occurrence of the event corresponds to the third section (S880), the second control module 430 records an image captured after the time of occurrence of the event in the second recording zone 520 (S890).

The event recording unit 400 can use the images stored in the second recording zone 520 to analyze the cause of an accident or abnormality later.

An abnormal situation notification function of the event recording unit 400 will hereinafter be described.

The second control module 430 may notify the first control module 260 of the occurrence of any abnormal situation in the event recording unit 400. The second control module 430 may transmit an event signal to the first control module 260 to notify the occurrence of an abnormal situation in the event recording unit 400 and may also transmit a message describing the details of an error situation to the first control module 260.

The second control module 430 may transmit an M-bit message (where M is a natural number of 2 or greater) describing an error situation in the event recording unit 400 to the first control module 260. For example, referring to FIG. 9, the second control module 430 may transmit an 8-bit signal, i.e., "00000001", to the first control module 260 when "CAM 1" is not engaged, may transmit "00000011" to the first control module 260 when "CAM 2" is not engaged, and may transmit "00000111" to the first control module 260 when both "CAM 1" and "CAM 2" are not engaged. For example, the second control module 430 may transmit "00001111" to the first control module 260 when an SD memory card is not engaged and may transmit "00011111" to the first control module 260 when the expiration of the life of the SD memory card is imminent.

However, the present disclosure is not limited to these examples. Alternatively, the second control module 430 may use two signal generators, i.e., first and second signal generators, which are of different types, to transmit a message describing any error situation to the first control module 260. Alternatively, the second control module 430 may transmit a message describing any error situation to the first control module 260 using not only the two signal generators, but also an alarm signal.

The second control module 430 may transmit an event signal to the manager terminal to notify the manager terminal of the occurrence of an abnormal situation in the event recording unit 400 and may then transmit a message describing the details of the abnormal situation to the manager terminal.

Figures 9, 10:
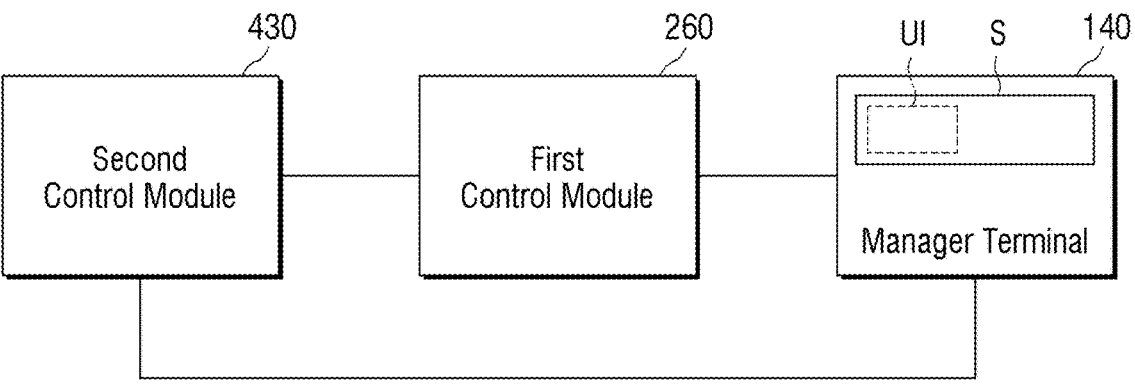
FIG. 9 is a table illustrating an abnormal situation notification function of the second control module of the event recording unit of FIG. 4.
FIG. 10 is a block diagram illustrating a user setting function of the second control module of the event recording unit of FIG. 4.

FIG. 9 is a table illustrating an abnormal situation notification function of the second control module of the event recording unit of FIG. 4. The abnormal situation notification function of the second control module 430 is not limited to the example of FIG. 9.

Referring to FIG. 9, "CAM 1" refers to the first camera module 410a, and "CAM 2" refers to the second camera module 410b. The first and second signal generators may be, for example, red and green light-emitting diodes (LEDs), respectively.

According to the abnormal situation notification function described above with reference to FIG. 9, as the first control module 260 is notified of when to replace an SD memory card based on the result of the calculation of the life of the SD memory card and reports it to a higher server (e.g., the manager terminal), the SD memory card can be replaced before the expiration of the life of the SD memory card. Also, an operator (or the manager) can identify the remaining life of an SD memory card via access in a manager mode.

After reporting the occurrence of an abnormal and the details of an error situation to the first control module 260, the second control module 430 may communicate with the first control module 260 and may record the content of the communication as a log to be used later for analysis.

A user setting function of the event recording unit 400 will hereinafter be described. FIG. 10 is a block diagram illustrating the user setting function of the second control module of the event recording unit of FIG. 4.

Referring to FIG. 10, the second control module 430 may provide a user interface UI on a screen S of a manager terminal 410 to allow the operator to set information regarding the event recording unit 400 remotely. In this case, the user interface UI, which is displayed on the screen S of the manager terminal 140, may include various information such as, for example, current time, image capture, time synchronization, the number of cameras, video capacity (in the unit of time), event folder capacity (i.e., the size of the second recording zone 520 in the first recording zone 510), password, and setting information (e.g., program update (or firmware update) information).

The second control module 430 may be communicatively connected to the first control module 260, and the first control module 260 may be communicatively connected to the manager terminal 140. The second control module 430 may access the manager terminal 140 through the first control module 260 to provide the user interface UI on the screen S of the manager terminal 140. Alternatively, the second control module 430 may directly access the manager terminal 140 without mediation of the first control module 260 to provide the user interface UI on the screen S of the manager terminal 140. In this manner, a program update can be set and performed remotely without the need to separate the SD memory card from the event recording unit 400.

The second control module 430 may provide the function of entering a password via the user interface UI when attempting to access the first or second recording zone 510 or 520 or to play the images stored in the first or second recording zone 510 or 520. The second control module 430 may allow the password to be changed only through the manager mode, thereby allowing only authorized users to be play the images stored in the first or second recording zone 510 or 520.

Figure 11:
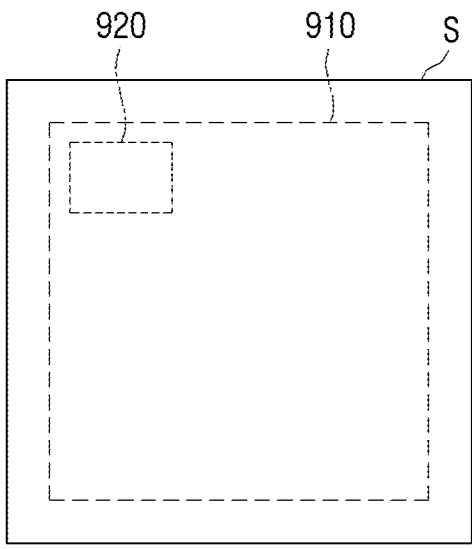
FIG. 11 is a schematic view illustrating an image display function of the second control module of the event recording unit of FIG. 4.

An image display function of the event recording unit 400 will hereinafter be described. FIG. 11 is a schematic view illustrating an image display function of the second control module of the event recording unit of FIG. 4.

Referring to FIG. 11, the second control module 430 may display images captured by the first and second camera modules 410*a* and 410*b*, in real time, on the screen S of the manager terminal 140. In this case, the second control module 430 may access the manager terminal 140 via the first control module 260 or may directly access the manager terminal 140 without mediation of the first control module 260.

The second control module 430 may acquire first data (e.g., node information, error indication, and speed) regarding the container transport apparatus 110 from the first control module 260. The second control module 430 may also acquire second data regarding images captured by the first and second camera modules 410*a* and 410*b* on its own. When the captured images are displayed on the screen S of the manager terminal 140, the second control module 430 may also display the first data and/or the second data on the screen S of the manager terminal 140 together with the captured images. In this manner, the second control module 430 can easily acquire data regarding the container transport apparatus 110 by interworking with the first control module 260.

Also, as an area 920 in which the first data and/or the second data is to be displayed is provided in an edge part of an area 910 in which captured images are to be displayed, the operator can easily identify the captured images. Also, as not only the captured images, but also data regarding the container transport apparatus 110 is displayed on the screen S of the manager terminal 140, the operator does not need to communicate with the container transport apparatus 110 to identify the data regarding the container transport apparatus 110.

An obstacle detection function of the second control module 430 will hereinafter be described.

The second control module 430 may determine whether there exists an obstacle on the moving route of the container transport apparatus 110 based on images captured by the first and second camera modules 410*a* and 410*b*. The second control module 430 may perform image learning on various types of obstacles present on the rails 330*a* and 330*b*. Then, if an image of an obstacle is acquired by the first or second camera module 410*a* and 410*b*, the second control module 430 may notify the first control module 260 to prevent a collision with the obstacle.

In a case where an obstacle is detected on the moving route of the container transport apparatus 110, the second control module 430 may also detect broken or cracked track cables or the presence of any foreign bodies on at least one of the rails 330*a* and 330*b*.

Figure 12:
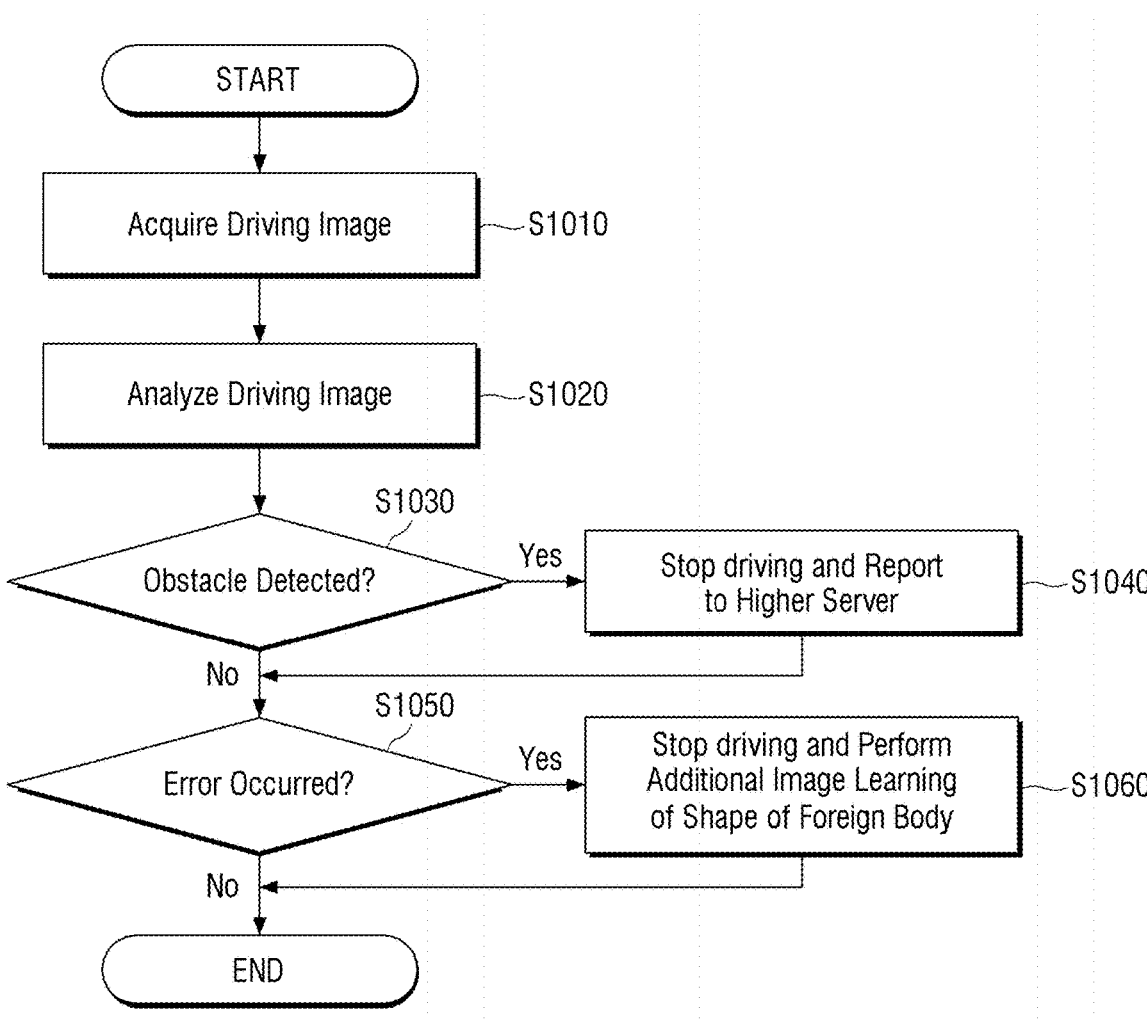
FIG. 12 is a flowchart illustrating an operating method for an obstacle detection function of the second control module of the event recording unit of FIG. 4.

FIG. 12 is a flowchart illustrating an operating method for an obstacle detection function of the second control module of the event recording unit of FIG. 4.

Referring to FIG. 12, when the container transport apparatus 110 travels on the rails 330*a* and 330*b* to transport a container 310, the second control module 430 acquire driving images of the container transport apparatus 110 in real time via the first and second camera modules 410*a* and 410*b* (S1010).

Thereafter, the second control module 430 analyzes the acquired images (S1020) and determines whether there exists an obstacle on the moving route of the container transport apparatus 110 based on the result of the analysis (S1030).

If it is determined that there exists an obstacle on the moving route of the container transport apparatus 110, the second control module 430 stops the driving of the container transport apparatus 110 and reports the acquired images and the result of the analysis to the manager terminal 140 (S1040).

Error may occur during the driving of the container transport apparatus 110 due to a foreign body yet to be registered as an obstacle (S1050). In this case, the second control module 430 stops the driving of the container transport apparatus 110 and registers the foreign body as an obstacle (S1060) by performing additional image learning on the acquired images.

If error occurs during the driving of the container transport apparatus 110, the second control module 430 may detect the presence of a foreign body on the driving route of the container transport apparatus 110 by performing image learning on images captured at the time of the occurrence of the error.

An emergency monitoring function of the event recording unit 400 will hereinafter be described.

In the semiconductor fabrication plant, a plurality of container transport apparatuses 110, i.e., the container transport apparatuses 110*a*, 110*b*, . . . , and 110*n*, may be driven, and various accidents may occur during the transport of containers 310 by the container transport apparatuses 110*a*, 110*b*, . . . , and 110*n*. For example, the container transport apparatus 110*a* may deviate from its moving route while driving to a predetermined destination, a fire may occur in the container transport apparatus 110*a*, or the container transport apparatus 110*a* may collide with the container transport apparatus 110*b* or 110*c* at a crossroad. In this example, the event recording unit 400 may operate as follows.

When an accident such as a collision or a fire occurs, a container transport apparatus 110*k* nearest to the scene of the accident may be dispatched to the scene of the accident. Then, an event recording unit 400 of the container transport apparatus 100*k* may capture images of the scene of the accident, and a first control module 260 of the container transport apparatus 110*k* may transmit and report the captured images to the manager terminal 140. Here, the first control module 260 of the container transport apparatus 110*k* may transmit not only images captured at the time of the accident, but also images captured before the time of the accident, to the manager terminal 140 for the analysis of the cause of the accident. Alternatively, a second control module 430 of the event recording unit 400 of the container transport apparatus 100k may transmit and report the captured images directly to the manager terminal 140. Once images of the scene of accident are provided to the manager terminal 140, the operator may be able to readily identify the state of affairs at the scene of the accident and take appropriate measures.

In case of an accident or an emergency such as a collision or a fire, the nearest container transport apparatus 110 to the scene of the accident may be dispatched, but the present disclosure is not limited thereto. Alternatively, if multiple container transport apparatuses 110 are located within a predetermined distance from the scene of the accident, one of the multiple container transport apparatuses 110 may be selectively dispatched to the scene of the accident.

For example, an idle container transport apparatus 110 may be detected from among the multiple container transport apparatuses 110 within the predetermined distance from the scene of the accident and may then be dispatched to the scene of the accident. Alternatively, if there are more than two idle container transport apparatuses 110 among the multiple container transport apparatuses 110 within the predetermined distance from the scene of the accident, the nearest idle container transport apparatus 110 may be dispatched to the scene of the accident. Alternatively, if the nearest container transport apparatus 110 to the scene of the accident is not idle, transporting a container 310 to its destination, the nearest idle container transport apparatus 110 may also be dispatched to the scene of the accident.

Figure 13:
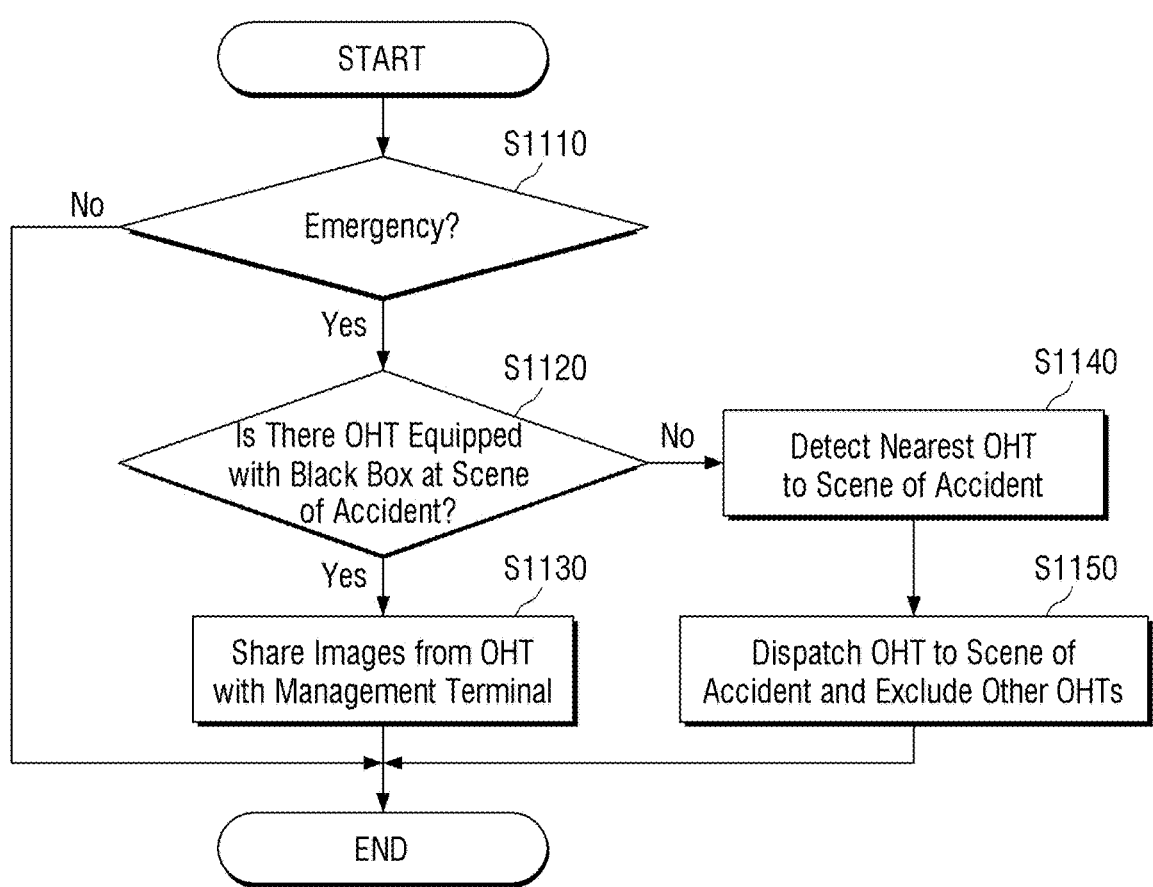
FIG. 13 is a flowchart illustrating an emergency monitoring function of the second control module of the event recording unit of FIG. 4.

FIG. 13 is a flowchart illustrating an emergency monitoring function of the second control module of the event recording unit of FIG. 4.

Referring to FIG. 13, the transport control apparatus 120 determines whether an emergency has occurred in the semiconductor fabrication plant (S1110) by monitoring images provided by the container transport apparatuses 110a, 110b, . . . , and 110n.

If it is determined that an emergency or an accident has occurred in the semiconductor fabrication plant, the transport control apparatus 120 determines whether there exists a container transport apparatus 110 equipped with an event recording unit 400, i.e., a container transport apparatus 110i, at the scene of the accident (1120).

If it is determined that the container transport apparatus 110i is at the scene of the accident, the container transport apparatus 110i may be dispatched to the scene of the accident under the control of the transport control apparatus 120 to capture images of the scene of the accident and to provide the captured images to the manager terminal 140 (S1130).

On the contrary, if it is determined that the container transport apparatus 110i is not at the scene of the accident, the transport control apparatus 120 may detect a nearest container transport apparatus 110 to the scene of the accident, i.e., a container transport apparatus 110j (S1140).

Then, the container transport apparatus 110j may be dispatched to the scene of the accident under the control of the transport control apparatus 120 to capture images of the scene of the accident and to provide the captured images to the manager terminal 140 (S1150).

The present disclosure, which relates to an event recording unit that can function as a black box, a container transport apparatus including the event recording unit, and a logistics transport system, has the following advantages.

First, the life of an SD memory card can be lengthened as much as possible by mainly using a continuous recording function.

Second, a second control module of the event recording unit can secure sensor monitoring images of the container transport apparatus by communicating with a first control module of the container transport apparatus in a wired/wireless manner. That is, as the first and second control modules are communicatively connected, signals from various sensors installed in the container transport apparatus can be shared between the first and second control modules, and as a result, relevant images can be easily secured.

Third, as the event recording unit can be set and updated remotely, convenience can be provided to the operator.

Fourth, as not only images, but also data regarding the container transport apparatus is displayed on the screen of a manager terminal, the operator can easily identify the circumstances of the container transport apparatus and can easily determine the cause of any error or defect.

Fifth, as the container transport apparatus equipped with the event recording unit can be dispatched to a scene of an emergency or accident, the manager can quickly identify the state of affairs at the scene of the emergency or accident with the naked eyes.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

What is claimed is:

1. A container transport apparatus comprising:
a gripping module gripping a container with a plurality of substrates accommodated therein;
an elevation module lifting up or down the gripping module;
a driving module controlling driving wheels to drive on rails;
a first control module controlling the gripping module, the elevation module, and the driving module; and
an event recording unit continuously recording surroundings of the container transport apparatus and recording any events when the container transport apparatus is driving on the rails,
wherein the event recording unit displays data on a screen of a manager terminal when displaying recorded images on the screen of the manager terminal, and
wherein the event recording unit records a first image, which is a continuously recorded image, in a first zone from which images can be deleted and records a second image, which is associated with an event, in a second zone from which images cannot be deleted.

2. The container transport apparatus of claim 1, wherein the event recording unit includes a plurality of camera modules, which capture images of the container transport apparatus in different directions, a storage module, which store the images captured by the camera modules, and a second control module, which controls the camera modules and the storage module.

3. The container transport apparatus of claim 1, wherein the second zone is included in the first zone.

4. The container transport apparatus of claim 1, wherein if there is an insufficient storage space for the second image, the event recording unit provides an additional second zone in which to store the second image, in the first zone or records the second image in the second zone after transmitting one of a plurality of existing second images present in the second zone to the manager terminal.

5. The container transport apparatus of claim 1, wherein the event recording unit records, as the second image, an image captured at a time of occurrence of an event separately or additionally records at least one of an image captured before the time of occurrence of the event and an image captured after the time of occurrence of the event, depending on the time of occurrence of the event.

6. The container transport apparatus of claim 5, wherein the event recording unit divides the image captured at the time of occurrence of the event into first, second, and third sections according to a lapse of time, records the image captured at the time of occurrence of the event and the image captured before the time of occurrence of the event separately if the time of occurrence of the event is associated with the first section, records only the image captured at the time of occurrence of the event separately if the time of occurrence of the event is associated with the second section, and records the image captured at the time of occurrence of the event and the image captured after the time of occurrence of the event separately if the time of occurrence of the event is associated with the third section.

7. The container transport apparatus of claim 1, wherein if error occurs in the event recording unit, the event recording unit transmits a message explaining the error to the first control module and the manager terminal by using a binary signal or by using at least two of a first signal generator, a second signal generator, which is of a different type from the first signal generator, and an alarm signal.

8. The container transport apparatus of claim 7, wherein the error is identified by bit values of the binary signal when using the binary signal or by types of operations of the first signal generator, the second signal generator, and the alarm signal when using the at least two of the first signal generator, the second signal generator, and the alarm signal.

9. The container transport apparatus of claim 7, wherein the event recording unit includes a detachable card-type storage medium and provides information regarding a remaining life of the storage medium.

10. The container transport apparatus of claim 1, wherein the event recording unit provides a user interface for remote control on the screen of the manager terminal.

11. The container transport apparatus of claim 10, wherein in response to a request for the transmission of the second image, the event recording unit additionally provides a user interface for entering a password.

12. The container transport apparatus of claim 1, wherein the data is displayed in an edge part of an area where the recorded images are displayed.

13. The container transport apparatus of claim 1, wherein the event recording unit determines whether there exists an obstacle on a driving route of the container transport apparatus, based on a result of image learning.

14. The container transport apparatus of claim 1, wherein if the container transport apparatus is dispatched to a scene of an accident, the event recording unit transmits, as the first image or the second image, images associated with the scene of the accident to the first control module or the manager terminal.

15. The container transport apparatus of claim 14, wherein the dispatched container transport apparatus is a nearest container transport apparatus to the scene of the accident or an idle container transport apparatus.

16. A container transport apparatus comprising:
a gripping module gripping a container with a plurality of substrates accommodated therein;

an elevation module lifting up or down the gripping module;
a driving module controlling driving wheels to drive on rails;
a first control module controlling the gripping module, the elevation module, and the driving module; and
an event recording unit continuously recording surroundings of the container transport apparatus and recording any events when the container transport apparatus is driving on the rails,
wherein
the event recording unit displays data on a screen of a manager terminal when displaying recorded images on the screen of the manager terminal,
the event recording unit records a first image, which is a continuously recorded image, in a first zone from which images can be deleted and records a second image, which is associated with an event, in a second zone from which images cannot be deleted,
the event recording unit records an image captured at a time of occurrence of the event separately or additionally records at least one of an image captured before the time of occurrence of the event and an image captured after the time of occurrence of the event, depending on the time of occurrence of the event,
if error occurs in the event recording unit, the event recording unit transmits a message explaining the error to the first control module and the manager terminal by using a binary signal or by using at least two of a first signal generator, a second signal generator, which is of a different type from the first signal generator, and an alarm signal,
the event recording unit provides a user interface for remote control on the screen of the manager terminal, and
if the container transport apparatus is dispatched to a scene of an accident, the event recording unit transmits images associated with the scene of the accident to the first control module or the manager terminal.

17. A logistics transport system comprising:
a plurality of container transport apparatuses transporting containers with a plurality of substrates accommodated therein; and
a transport control apparatus controlling the container transport apparatuses,
wherein
at least one of the container transport apparatuses includes a gripping module gripping a container with a plurality of substrates accommodated therein, an elevation module lifting up or down the gripping module, a driving module controlling driving wheels to drive on rails, a first control module controlling the gripping module, the elevation module, and the driving module, and an event recording unit continuously recording surroundings of the container transport apparatus and recording any events when the container transport apparatus is driving on the rails, and
the event recording unit displays data on a screen of a manager terminal when displaying recorded images on the screen of the manager terminal, and
the event recording unit records a first image, which is a continuously recorded image, in a first zone from which images can be deleted and records a second image, which is associated with an event, in a second zone from which images cannot be deleted.

18. The logistics transport system of claim 17, wherein the transport control apparatus determines whether the container transport apparatus including the event recording unit is located at a scene of an accident.

19. The logistics transport system of claim 18, wherein the transport control apparatus dispatches a nearest container transport apparatus to the scene of the accident.

\*    \*    \*    \*    \*